(12) United States Patent
Nakanishi et al.

(10) Patent No.: US 7,021,841 B2
(45) Date of Patent: Apr. 4, 2006

(54) OPTICAL RECEIVER AND METHOD OF PRODUCING THE OPTICAL RECEIVER

(75) Inventors: Hiromi Nakanishi, Osaka (JP); Yoshiki Kuhara, Osaka (JP); Akira Yamaguchi, Osaka (JP); Mitsuaki Nishie, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 161 days.

(21) Appl. No.: 10/664,690

(22) Filed: Sep. 18, 2003

(65) Prior Publication Data

US 2004/0071411 A1 Apr. 15, 2004

(30) Foreign Application Priority Data

Oct. 15, 2002 (JP) .............................. 2002-300988

(51) Int. Cl.
*G02B 6/36* (2006.01)
(52) U.S. Cl. .............................. 385/92; 385/83; 385/18; 385/88; 385/52
(58) Field of Classification Search .................. 385/92, 385/83, 88, 52, 53, 56, 65, 31, 18
See application file for complete search history.

(56) References Cited

U.S. PATENT DOCUMENTS

| 4,608,586 | A | | 8/1986 | Kim | |
|---|---|---|---|---|---|
| 6,043,550 | A | * | 3/2000 | Kuhara et al. ............... | 257/461 |
| 6,340,831 | B1 | * | 1/2002 | Kuhara et al. ............... | 257/461 |
| 6,445,858 | B1 | * | 9/2002 | Musk ........................... | 385/52 |
| 6,530,698 | B1 | * | 3/2003 | Kuhara et al. ................ | 385/88 |
| 6,704,488 | B1 | * | 3/2004 | Lavallee et al. ............. | 385/137 |
| 6,808,316 | B1 | * | 10/2004 | Nakanishi et al. ............ | 385/88 |
| 2002/0071638 | A1 | * | 6/2002 | Musk ........................... | 385/52 |
| 2003/0002820 | A1 | * | 1/2003 | Nakanishi et al. ............ | 385/88 |
| 2003/0063889 | A1 | * | 4/2003 | Lavallee et al. ............. | 385/137 |
| 2004/0246477 | A1 | * | 12/2004 | Moon et al. ................. | 356/300 |

FOREIGN PATENT DOCUMENTS

| JP | 05-333244 | 12/1993 |
|---|---|---|
| JP | 7-199006 | 8/1995 |

(Continued)

OTHER PUBLICATIONS

Sze, (1981) "Physics of Semiconductor Devices", A Wiley-Interscience Publn. By John Wiley & Sons, Inc., pp 762-765.

*Primary Examiner*—Kaveh Kianni
(74) *Attorney, Agent, or Firm*—Fish & Richardson P.C.

(57) ABSTRACT

An optical receiver comprises (a) an optical fiber, (b) a rear-illuminated type PD for receiving incoming light emerging from the optical fiber, (c) a submount supporting the PD, (d) a coaxial type package housing the submount, and (e) a preamplifier IC for amplifying electric signals from the PD. In particular, the submount is provided with a reflecting face for reflecting the incoming light so that the light can enter the PD. The submount may be provided with an optical path-forming groove having at least one reflecting face for introducing and reflecting the incoming light so that the light can enter the light-receiving portion of the PD mounted on the submount. This structure enables the production of an optical receiver most suitable for high-speed response and excellent in productivity. A method of producing the optical receiver is also offered.

19 Claims, 9 Drawing Sheets

FOREIGN PATENT DOCUMENTS

| JP | 09-061678 | 3/1997 |
| JP | 11-083619 | 3/1999 |
| JP | 2000-036615 | 2/2000 |
| JP | 2002-064212 | 2/2002 |

* cited by examiner

OPTICAL RECEIVER AND METHOD OF PRODUCING THE OPTICAL RECEIVER

BACKGROUND OF THE INVENTION

1. Field of the Invention

The present invention relates to an optical receiver for optical communication and a method of producing the optical receiver, and in particular to an optical receiver having high sensitivity, a capability to perform high-speed response, and superior productivity and a method of producing the optical receiver.

2. Description of the Background Art

FIGS. 7(A) and 7(B) are vertical cross sections showing the structure of a conventional optical receiver. FIG. 7(A) is a sectional front view, and FIG. 7(B) is a sectional side view at the B—B section shown in FIG. 7(A). In FIGS. 7(A) and 7(B), an optical receiver 100 is known as a pigtail type using a coaxial type package. The optical receiver 100 is assembled by the following process. A submount 102 is fixed onto a package 103. A photodiode (PD) 101 used as a light-receiving device is fixed onto the submount 102 by soldering. A plurality of lead pins 104 penetrate the package 103 to feed electric power and to take out electric signals. Wires 105 connect between the lead pins 104 and the PD 101 and between the lead pins 104 and the submount 102. A cap 107 provided with a condenser lens 106 at the top covers the submount 102. An optical fiber 108 is securely held at a place over the lens 106. A cover is applied over the package 103 to complete the assembly. The cover is shown in FIGS. 7(A) and 7(B) by a broken line that connects the optical fiber 108 and the package 103. In the optical receiver 100, the PD 101 receives incoming light emerging from the optical fiber 108 after it passes through the condenser lens 106.

In the foregoing optical receiver using a coaxial type package, a front-illuminated type light-receiving device is usually used. The front-illuminated type light-receiving device is formed by the following manner, for example. FIG. 8 is a cross-sectional view schematically showing a front-illuminated type light-receiving device. A light-receiving layer 111 made of n-type InGaAs is epitaxially grown on an n-type InP substrate 110. A p-type Zn-diffused layer 112 is formed at the central portion of the light-receiving layer 111 to form a p-n junction. An $SiN_x$ layer 113 is formed on the light-receiving layer 111 to protect the p-n junction. An n-type electrode 114 is formed on the back face of the substrate 110. A p-type electrode 115 is formed on the Zn-diffused layer 112. This concludes the formation of the front-illuminated type light-receiving device. Additionally, a bonding pad 116 to be used as a space for bonding a wire 105 is formed such that the bonding pad 116 covers a part of the $SiN_x$ layer 113 with maintaining an electrical connection with the p-type electrode 115. Such a front-illuminated type light-receiving device usually introduces light from the front side where the Zn-diffused layer 112 is exposed as shown in FIG. 8.

On the other hand, an optical module using a rear-illuminated type light-receiving device is also known as shown by published Japanese patent application Tokukaihei 7-199006. FIG. 9 is a cross-sectional view schematically showing a rear-illuminated type light-receiving device. The rear-illuminated type light-receiving device is formed by the following process, for example. As with the front-illuminated type light-receiving device, a light-receiving layer 121 made of n-type InGaAs is epitaxially grown on an n-type InP substrate 120. A p-type Zn-diffused layer 122 is formed at the central portion of the light-receiving layer 121 to form a p-n junction. An $SiN_x$ layer 123 is formed on the light-receiving layer 121 to protect the p-n junction. An n-type electrode 124 is formed on the back face of the substrate 120 such that the n-type electrode 124 has a proper opening to expose a part of the substrate 120 so that incoming light can be introduced. A p-type electrode 125 is formed to cover the central portion of the Zn-diffused layer 122. This concludes the formation of the rear-illuminated type light-receiving device. As described above, a rear-illuminated type light-receiving device usually introduces light from the rear side where the substrate 120 is exposed as shown in FIG. 9. In this device, the top surface of the p-type electrode 125 is plated with gold or another material (not shown in FIG. 9) to allow the direct bonding of a wire 105 as shown in FIG. 9.

The optical communications system has been widely used in recent years. This situation requires that the optical receiver be mass-produced at a lower cost in a shorter time. The transmission capacity of the communications system is also required to increase from the conventional 156 Mbps and 622 Mbps or so to 1 Gbps and 2.5 Gbps or even higher to achieve high-speed, large-capacity transmission.

As described above, an optical receiver incorporating a coaxial type package usually uses a front-illuminated type light-receiving device, which is easy to mount in such a way that the light-receiving layer faces the incoming light in a direction perpendicular to the optical axis of the incoming light. In spite of this advantage, the front-illuminated type light-receiving device has a response speed no more than 1 Gbps or so. In other words, the device has an undesirable limitation to be used for a higher-speed and larger-capacity transmission.

On the other hand, the rear-illuminated type light-receiving device is known as a suitable device for high-speed response. However, when this type of device is used in the coaxial type package, it is necessary to provide an optical path-forming groove or another means in the submount in order to introduce incoming light. Generally, the formation of the groove and other means reduces the productivity. The above-mentioned Tokukaihei 7-199006 has no description on the optical receiver incorporating the coaxial type package.

SUMMARY OF THE INVENTION

The coaxial type package, particularly a coaxial type package made with metal, has the following superior properties: (a) It can be hermetically sealed by welding. (b) It is highly heat dissipative. (c) It can effectively block external electromagnetic noise. In addition, this type of package has been widely used and consequently produced on a mass production basis. In other words, it is highly economical. In view of the above advantages, the principal object of the present invention is to offer an optical receiver that incorporates a coaxial type package, that is most suitable for high-speed response, and that has superior productivity and a method of producing the optical receiver.

According to the present invention, the foregoing object is attained by using a rear-illuminated type light-receiving device and by providing a submount with a reflecting face for reflecting incoming light.

More specifically, the optical receiver of the present invention comprises:

(a) an optical fiber;
(b) a rear-illuminated type light-receiving device for receiving incoming light emerging from the optical fiber;

(c) a submount that:
  (c1) supports the light-receiving device; and
  (c2) is provided with a reflecting face for reflecting the incoming light so that the light can enter the light-receiving device; and
(d) a coaxial type package housing the submount.

The optical receiver can be produced by the following steps:
(1) a step for providing the submount with the reflecting face in order to reflect incoming light emerging from the optical fiber so that the light can enter the rear-illuminated type light-receiving device;
(2) a step for forming a submodule by mounting the light-receiving device for receiving the incoming light on the submount;
(3) a step for housing the submodule in the coaxial type package; and
(4) a step for connecting lead pins provided on the package to the light-receiving device with wires.

In the conventional optical receiver using a coaxial type package, whose central axis is aligned with the optical axis, a front-illuminated type light-receiving device is commonly used because the incoming light can be easily introduced into the light-receiving layer of the device by mounting the device at the center of the package. However, the optical receiver using a front-illuminated type light-receiving device is slower in response and poorer in productivity than the optical receiver using a rear-illuminated type light-receiving device.

The response speed of a light-receiving device is generally determined by the product of the load resistance R and the junction capacitance Cj. As the product increases, the response speed decreases. The junction capacitance Cj is proportional to the junction area, which is determined by the diameter of the p-n junction. Therefore, when the diameter of the p-n junction of a front-illuminated type light-receiving device is equal to that of a rear-illuminated type light-receiving device (in this case, the two devices have the same response speed), the effective light-receiving area of the rear-illuminated type can be much larger than that of the front-illuminated type (compare FIGS. 8 and 9). Consequently, the rear-illuminated type has a wide permissible range in light-gathering design, so that a complex optical system for strictly gathering the incoming light emerging from the optical fiber is not required. In other words, the rear-illuminated type allows a wide permissible range in the positional deviation between the light-receiving device and the optical fiber. Therefore, the light-receiving device can be mounted without paying strict attention. As a result, the rear-illuminated type light-receiving device nearly eliminates the operation for adjusting the axis of the optical fiber, can decrease the mounting time, and consequently has superior productivity.

FIGS. 10(A) and 10(B) are cross-sectional views schematically showing the two types of light-receiving devices when the two types have the same effective light-receiving area. FIG. 10(A) shows the front-illuminated type and FIG. 10(B) shows the rear-illuminated type. In this case, the diameter of the p-n junction of the front-illuminated type light-receiving device must be much larger than that of the rear-illuminated type light-receiving device. A larger diameter of the p-n junction means a larger junction capacitance, Cj. Therefore, the front-illuminated type has a lower response speed and is unsuitable for response at higher speed.

As shown in FIG. 8, in the front-illuminated type light-receiving device, the bonding pad 116 is formed such that it covers a part of the $SiN_x$ layer 113 to enable the bonding of the wire 105. In this case, the bonded portion 105a of the wire 105 is usually crushed and spreads, and sometimes it covers part of the Zn-diffused layer 112. When this covering occurs, the effective light-receiving area is further decreased. Consequently, the front-illuminated type requires a stricter control of light gathering, reducing the productivity.

On the other hand, the rear-illuminated type light-receiving device usually has a circular light-receiving portion, facilitating the receiving of light. This easy reception of light also contributes to the above-described wide permissible range in the positional deviation at the time of the mounting operation. With the rear-illuminated type, the size of the light-receiving portion can be reduced to a size required for the wire bonding on the p-type electrode. Consequently, the area of the p-n junction can be decreased, decreasing the junction capacitance Cj. As a result, the rear-illuminated type light-receiving device can be operated at a rate no less than 1 Gbps and therefore is most suitable for high-speed response.

When the rear-illuminated type light-receiving device is used in a coaxial type package, one practical idea is to form an optical path-forming groove in the submount for supporting the device in order to guide incoming light. However, it is rather difficult to form the groove in the submount. This is the reason why studies have not been sufficiently conducted to use the rear-illuminated type light-receiving device in a coaxial type package.

In view of the above-described circumstances, the optical receiver of the present invention uses a rear-illuminated type light-receiving device, which is capable of responding at a higher speed, has a wide permissible range of the mounting position, and enables the use of a relatively simple optical system. The optical receiver enables the use of the rear-illuminated type light-receiving device in a coaxial type package by providing the submount with a reflecting face for reflecting incoming light.

The present invention is explained below in detail. In the present invention, the types of light-receiving devices include a photodiode (PD) and an avalanche photodiode (APD). When the light-receiving layer aims at a long-wavelength band of a 1-μm band to a 1.6-μm band, the light-receiving device may be made of an InGaAs-based material or an InGaAsP-based material. These semiconductor light-receiving devices are desirable because they have high sensitivity in a long-wavelength band of a 1-μm band to a 1.6-μm band.

The submount on which the light-receiving device is mounted may be made of single-crystalline silicon, glass, or ceramic such as AlN or alumina ($Al_2O_3$). In particular, single-crystalline silicon is desirable because it can be processed with high precision by the photolithographic technology. Glass is desirable because it is not only transparent but also relatively low-price. Ceramic is desirable because it has good machinability.

In the present invention, the submount is provided with a reflecting face for reflecting the incoming light so that the light can enter the light-receiving device. The present inventors studied various methods for using the rear-illuminated type light-receiving device in a coaxial type package, and found that when the submount is provided with a reflecting face for reflecting the incoming light, the light can enter the light-receiving device without relying on an optical path-forming groove formed in the submount. Accordingly, the present invention provides the submount with a reflecting face for reflecting the incoming light. The reflecting face may be formed by providing a slanted face on the submount to be plated with metal such as gold. Although one reflecting face is usually sufficient, more than one reflecting face may be provided if the incoming light can be properly introduced into the light-receiving layer of the light-receiving device.

An optical path-forming groove may be provided in the submount to more securely guide the incoming light to the reflecting face. In this case, at least one face of the optical path-forming groove may be used as the reflecting face. The optical path-forming groove may be formed by etching such as photoetching. More specifically, it can be formed by the following process: (a) An oxide layer such as an $SiO_2$ layer is formed as an insulating layer on the submount by the chemical vapor deposition (CVD) method such as the plasma CVD method. (b) Part of the oxide layer and part of the submount are removed by a method such as chemical etching to form the groove. In this case, it is desirable to plate all the faces of the optical path-forming groove including the face for the reflecting face with metal such as gold to increase the reflection efficiency so that the output current can be increased.

The light-receiving device may be placed on the submount such that the face of the light-receiving device nearest to the incoming light emerging from the optical fiber is nearly perpendicular to the optical axis of the incoming light. In this configuration, however, part of the incoming light may be directly reflected at the nearest face of the light-receiving device to return to the optical fiber. If this returning phenomenon occurs, the light-emitting device at the signal-transmitting station may be unstabilized. To avoid this phenomenon, the light-receiving device may be placed on the submount such that the face of the light-receiving device nearest to the incoming light is not perpendicular to the optical axis of the incoming light. In this case, the perpendicular of the nearest face slants against the optical axis. It is desirable that the slanting angle be four to eight degrees or so.

In the present invention, a submodule formed by mounting the light-receiving device on the submount provided with the reflecting face is housed in a coaxial type package. The coaxial type package is a package whose central axis is aligned with the optical axis of the incoming light. The package may be made of metal such as iron (Fe), copper (Cu), copper-nickel (Cu—Ni) alloy, stainless steel, or iron alloy such as Fe—Co—Ni alloy. The coaxial type package made of metal has excellent long-term stability because it is mechanically strong and can be hermetically sealed. In addition, it is highly heat dissipative and can effectively block external electromagnetic noise. Generally, it is relatively low-price, and the cost of the optical receiver can be reduced. The submodule is housed in the package by soldering it to a submodule-supporting pole provided in the package with AuSn solder, AuPb solder, or SnPb solder. The soldering may be performed with an automatic die bonder.

The optical receiver of the present invention may be assembled either as a pigtail type, which is provided with an optical fiber at its one end, or as a receptacle type, which has at its one end a connecting portion for coupling with an optical connector. In either type, the light-receiving device is optically coupled with an optical fiber. More specifically, the pigtail type may have a structure in which a cylindrical metal holder securely holding an optical fiber is inserted into a metal sleeve supporting a coaxial type package, which securely holds a cap provided at its top portion with a condenser lens. The receptacle type may have a structure in which a connecting portion for coupling with a connector having an optical fiber ferrule is provided at its one end, and a coaxial type package housing a submodule is provided at its other end. The receptacle type is easy to handle because it does not require taking care of a long optical fiber.

As explained above, the optical receiver of the present invention is highly effective in achieving enhanced high-speed response, which is realized by using a rear-illuminated type light-receiving device. Consequently, the optical receiver can be applied to a high-speed, large-capacity transmission at a rate of 1 Gbps or more. In the optical receiver, the submount supporting the light-receiving device is provided with a reflecting face for reflecting incoming light. This structure enables the light-receiving device to be used in a coaxial type package without providing a optical path-forming groove in the submount. The use of the rear-illuminated type light-receiving device eliminates the necessity of a complex optical system, widening the permissible range of the positional deviation at the time of the mounting. As a result, the light-receiving device of the present invention has excellent productivity, enabling the production in a notably reduced time.

BRIEF DESCRIPTION OF THE DRAWINGS

In the drawings:

FIGS. 1(A) to 1(D) are views schematically showing the optical receiver of the present invention, in which FIG. 1(A) is a vertical cross section illustrating the entire optical receiver, FIG. 1(B) is an enlarged cross section showing a light-receiving device mounted on a submount, FIG. 1(C) is a plan view when the lens-holding cap shown in FIG. 1(A) is removed, and FIG. 1(D) is an enlarged cross section showing a light-receiving device mounted on a submount that directly reflects incoming light without introducing it into the submount.

FIGS. 2(A) to 2(C) are views schematically showing the optical receiver of the present invention provided with an optical path-forming groove, in which FIG. 2(A) is a vertical cross section illustrating the entire optical receiver, FIG. 2(B) is an enlarged cross section showing a light-receiving device mounted on a submount, and FIG. 2(C) is a plan view when the lens-holding cap shown in FIG. 2(A) is removed.

FIGS. 3(A) to 3(C) are views schematically showing the optical receiver of the present invention provided with an optical path-forming groove having two reflecting faces, in which FIG. 3(A) is a vertical cross section illustrating the entire optical receiver, FIG. 3(B) is an enlarged cross section showing a light-receiving device mounted on a submount, and FIG. 3(C) is a plan view when the lens-holding cap shown in FIG. 3(A) is removed.

FIGS. 7(A) and 7(B) are vertical cross sections showing the structure of a conventional optical receiver, in which FIG. 7(A) is a sectional front view, and FIG. 7(B) is a sectional side view at the B—B section shown in FIG. 7(A).

FIGS. 10(A) and 10(B) are cross-sectional views schematically showing the two types of light-receiving devices when the two types have the same effective light-receiving area, in which FIG. 10(A) shows the front-illuminated type and FIG. 10(B) shows the rear-illuminated type.

DETAILED DESCRIPTION OF THE INVENTION

Figure 1:
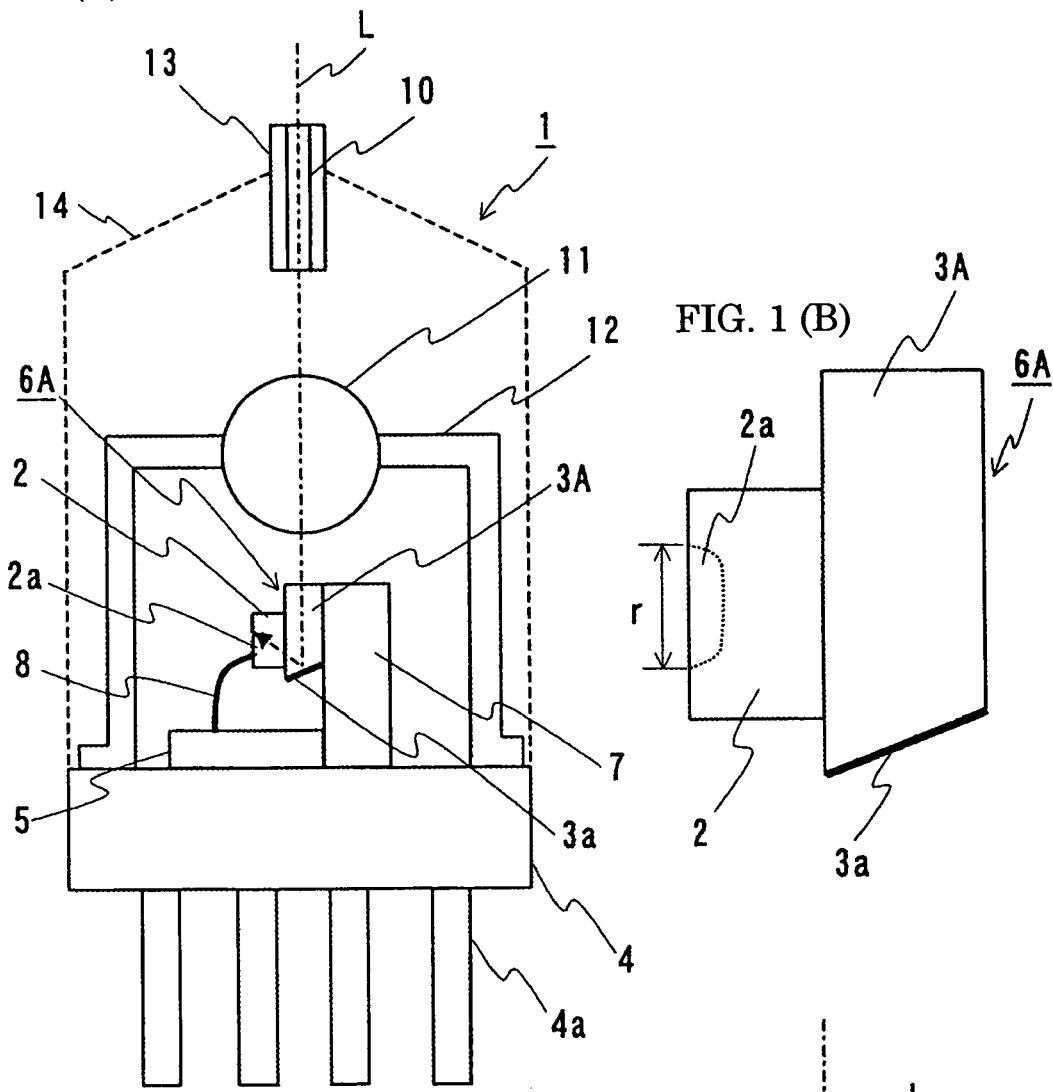

Embodiments of the present invention are explained below by referring to the accompanying drawings. To avoid duplicated explanations, the same signs and numerals are allocated to the same members throughout the drawings. The ratios of the dimensions in the drawings are not necessarily coincide with those of the explanations.

<Pigtail Type>

EXAMPLE 1

FIGS. 1(A) to 1(D) are views schematically showing the optical receiver of the present invention. FIG. 1(A) is a vertical cross section illustrating the entire optical receiver, FIG. 1(B) is an enlarged cross section showing a light-receiving device mounted on a submount, FIG. 1(C) is a plan view when the lens-holding cap shown in FIG. 1(A) is removed, and FIG. 1(D) is an enlarged cross section showing a light-receiving device mounted on a submount that directly reflects incoming light without introducing it into the submount. According to the present invention, an optical receiver 1 comprises an optical fiber 10, a rear-illuminated type photodiode (PD) 2 for receiving incoming light L emerging from the optical fiber 10, a submount 3A supporting the PD 2, a coaxial type package 4 housing the submount 3A, and a preamplifier IC 5 for amplifying signals from the PD 2. In particular, the submount 3A is provided with a reflecting face 3a to reflect the incoming light L so that the light L can enter the PD 2.

The optical receiver 1 of the present invention was produced by the following process.

(1) Step for Providing the Submount with a Reflecting Face

It is desirable that the submount be made of single-crystalline silicon, glass, or ceramic such as AlN or alumina ($Al_2O_3$). The submount may also be made of a plastic material such as epoxy resin or a liquid crystal polymer. The size of the submount has no special limitations provided that it can support the light-receiving device. For example, the submount may have a width of 0.5 to 1.25 mm, a length of 1.0 to 3.0 mm, and a thickness of 0.5 to 1.0 mm. It is desirable that the submount be provided with a mounting pattern in advance so that the light-receiving device can be readily mounted. The mounting pattern also serves as a positioning mark for the mounting operation. It can be formed by Au—Sn plating, for example. In this example, the submount 3A was made of glass and had a width of 1.25 mm, a length of 2.0 mm, and a thickness of 0.5 mm. In this example, the width means the vertical dimension in FIG. 1(C), the length means the maximum vertical dimension in FIG. 1(B), and the thickness means the horizontal dimension in FIG. 1(B). The dimensions of the PD 2, which is explained below, are expressed by the same method as above. With the PD 2, however, the length means the vertical dimension in FIG. 1(B). The reflecting face 3a was formed by the following process: (a) One side face of the submount 3A was polished to form a slanted face. (b) The slanted face was plated with gold. After the formation of the reflecting face 3a, the submount 3A was provided with the mounting pattern (not shown in the figure) for mounting the PD 2. The pattern was formed by Au—Sn plating and had a thickness of 3 μm.

(2) Step for Forming a Submodule

Figure 9:
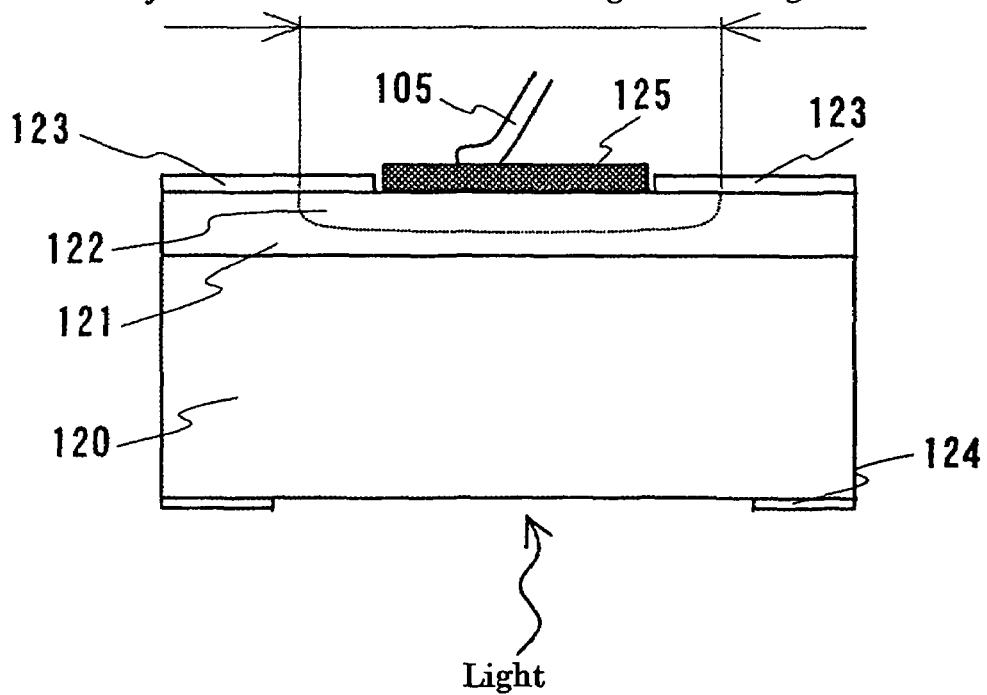
FIG. 9 is a cross-sectional view schematically showing a rear-illuminated type light-receiving device.
Figure 10:
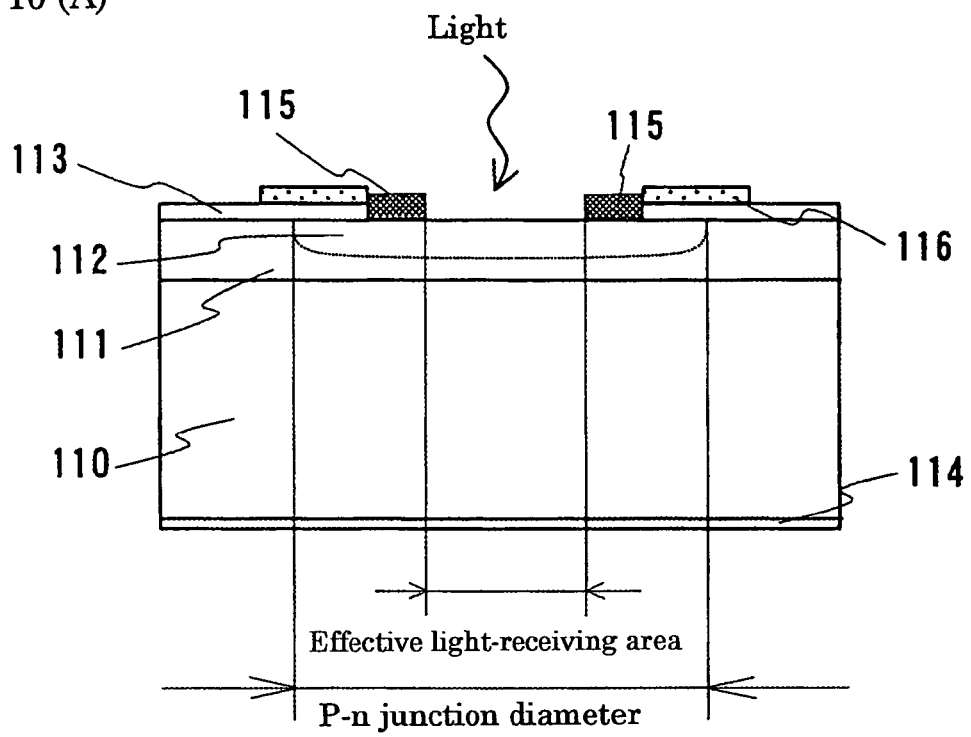
Figure 10:
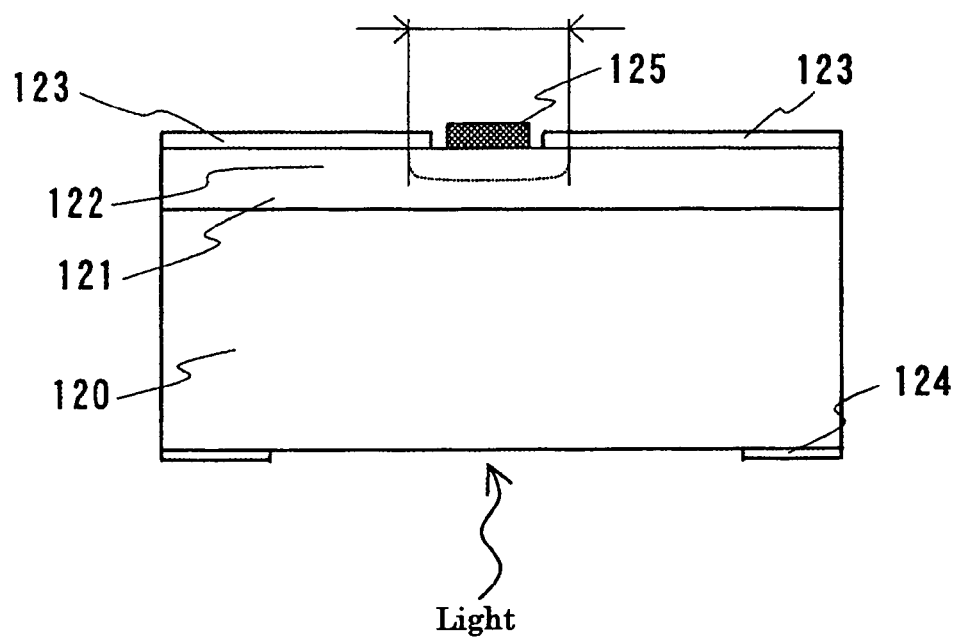

When the light-receiving device is made of an InGaAs-based material, for example, it may have a width of 0.5 to 0.7 mm, a length of 0.5 to 0.7 mm, and a thickness of 0.2 to 0.5 mm. In this example, the PD 2 was a rear-illuminated type light-receiving device as shown in FIG. 9. It had a width of 0.5 mm, a length of 0.5 mm, and a thickness of 0.2 mm. It had a light-receiving layer made of an InGaAsP-based material and aimed at a wavelength band of a 1-μm band to a 1.6-μm band. The PD 2 had an effective light-receiving area having a diameter, r, of 50 μm. When the light-receiving layer is aimed at the above-described wavelength band, the light-receiving device made of a material such as Ge may also be used. When the light-receiving layer is aimed at a shorter-wavelength band than the above-described wavelength band, the light-receiving device made of a material such as Si may be used. As shown in FIG. 1(B), the PD 2 was mounted on the submount 3A provided with the mounting pattern such that its rear face came into contact with the mounting pattern. Here, the rear face is a face opposite to the front face under which a light-receiving portion 2a is formed. This operation formed a submodule 6A. The light-receiving device may be mounted on the submount by soldering with PbSn or AuSn solder. It is desirable to perform the soldering by using an automatic soldering machine such as an automatic die bonder for semiconductor chips so that the soldering can be finished instantaneously. When the automatic die bonder is fed with the pattern-recognizing information on the position of the mounting pattern and the shape of the chip to be held by a semiconductor chip-sucking collet, the light-receiving device can be mounted at the predetermined position with high precision. In this example, the PD 2 was soldered by using an automatic die bonder with AuSn solder.

(3) Step for Assembling the Package

In this example, the coaxial type package 4 was made of iron and had a diameter of 5.6 mm. The package 4 was provided with a pole 7 for supporting the submodule 6A. It was also provided with lead pins 4a, which penetrated the package 4 to feed electric power and take out electric signals. The number of lead pins 4a can be in the range of three to six, depending on the design. This example used four lead pins 4a each having a diameter of 0.45 mm. In this example, the submodule 6A was placed such that the light-receiving layer of the PD 2 was nearly parallel to the optical axis of the incoming light L emerging from the optical fiber 10. In this case, the reflecting face 3a of the submount 3A faced the incoming light L. The submodule 6A was attached to the pole 7 by soldering with an automatic die bonder using AuSn solder. In this case, the light-receiving portion 2a of the PD 2 faced the left-hand side in FIG. 1(A). When the submodule 6A is attached to the pole 7 by temporarily turning the package 4 by 90 degrees from the state shown in FIG. 1(A) so that the submodule-attaching face of the pole 7 can face upward, it is easy to perform the attaching work.

As shown in FIGS. 1(A) and 1(C), the optical receiver of the present invention is further provided with a preamplifying device 5 that amplifies electric signals from the light-receiving device. The preamplifying device 5 may be a preamplifier IC such as an Si IC or a GaAs IC. For example, the preamplifying device 5 may have a width of 0.5 to 1.5 mm, a length of 0.5 to 1.5 mm, and a thickness of 0.2 to 1.0 mm. In the above expression, the width means the vertical dimension in FIG. 1(C), the length means the horizontal dimension in FIG. 1(C), and the thickness means the vertical dimension in FIG. 1(A). In this example, the preamplifying device 5 was an Si IC as a preamplifier IC. The Si IC had a width of 0.8 mm, a length of 0.8 mm, and a thickness of 0.3 mm. The preamplifying device 5 may be mounted directly on the coaxial type package 4 by bonding using conductive epoxy resin. In this case, the preamplifying device 5 is directly connected to the light-receiving device 2 by using metal wires such as gold (Au) wires or aluminum (Al) wires. This example employed this mounting method. The preamplifying device 5 may also be mounted on a board (circuit substrate) carrying the coaxial type package. In this case, the preamplifying device 5 is connected to the package with wires.

(4) Step for Connecting the Members by Using Wires

Gold wires 8 having a diameter of 30 µm were used to connect between the PD 2 and the mounted preamplifier IC 5, between the PD 2 and the lead pins 4a, between the preamplifier IC 5 and the lead pins 4a, and between the submodule 6A and the pole 7. The connection was performed continuously with an automatic wire bonder. As with Step (3) above, when the connection is performed by temporarily changing the direction of the submodule-attaching face of the pole 7 to the upward direction, it is easy to perform the connection. In FIGS. 1(A) to 1(C), not all the wires are shown.

(5) Step for Assembling the Optical Receiver

After the submodule 6A and the preamplifier IC 5 were mounted on the package 4, a cap 12 provided with a condenser lens 11 at its top portion was placed on the package 4 to be fixed to it by electric welding. When this operation is performed by positioning the package 4 such that the axes of the lead pins 4a are vertical as shown in FIG. 1(A), it is easy to perform this operation. The package 4 securely holding the cap 12 was attached to a metal sleeve (not shown in FIG. 1(A)). A cylindrical metal holder 13 securely holding the optical fiber 10 was inserted into the upper portion of the sleeve. Incoming light L emerging from the optical fiber 10 was introduced into the submount 3A to reflect the light at the reflecting face 3a so that the light could enter the light-receiving portion 2a of the PD 2. The position of the holder 13 was adjusted, and it was fixed to the sleeve when the PD 2 produced an optimum output. Finally, a cover 14 was applied over the sleeve such that the holder 13 penetrated the cover 14. This concluded the assembly of the pigtail-type optical receiver 1 of the present invention.

As shown in FIG. 1(A), the structure of this example enables the incoming light L to enter the light-receiving portion 2a of the PD 2 mounted on the submount 3A after it is introduced into the submount 3A and reflected at the reflecting face 3a.

As explained above, the optical receiver of the present invention is capable of performing a high-speed operation at a rate of 1 Gbps or more and is suitable for enhanced high-speed response, which is realized by using a rear-illuminated type light-receiving device. In particular, the structure in which the submount is provided with a reflecting face to reflect incoming light enables even a coaxial type package to be produced effectively.

In the above description, Example 1 is explained by using the submount 3A, which introduces incoming light into it. However, as shown in FIG. 11)), a submount 3A' that does not introduce incoming light into it may be used. This type of submount may be produced by using single-crystalline silicon, for example. In this case, it is recommended that as shown in FIG. 1(D), a submodule 6A' be mounted on the package 4 such that the reflecting face 3a faces upward to directly reflect the incoming light L.

EXAMPLE 2

Figure 2:
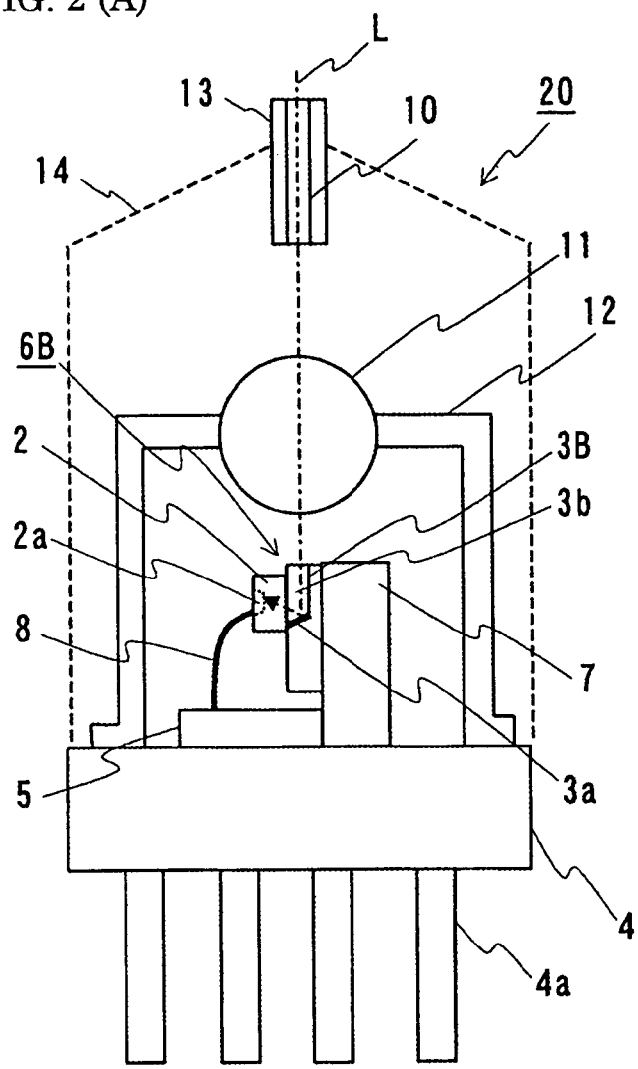
Figure 2:
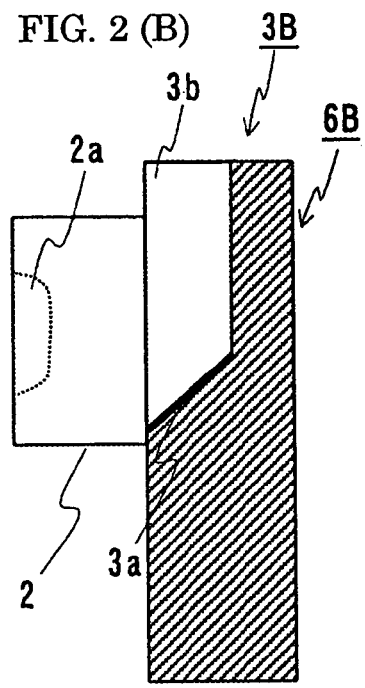
Figure 2:
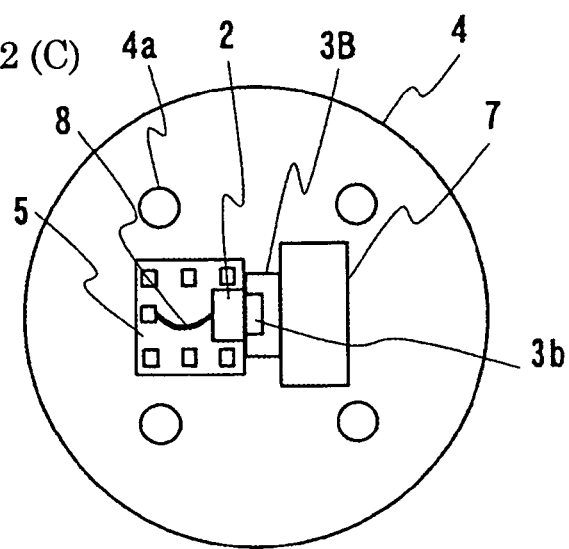

As explained above, Example 1 uses a submount provided with a reflecting face only. However, it is desirable that the submount be also provided with an optical path-forming groove to more securely guide incoming light to the reflecting face. Accordingly, an example in which the submount is provided with an optical path-forming groove in addition to the reflecting face is explained below. FIGS. 2(A) to 2(C) are views schematically showing the optical receiver of the present invention provided with an optical path-forming groove. FIG. 2(A) is a vertical cross section illustrating the entire optical receiver, FIG. 2(B) is an enlarged cross section showing a light-receiving device mounted on a submount, and FIG. 2(C) is a plan view when the lens-holding cap shown in FIG. 2(A) is removed. An optical receiver 20 of the present invention has the same basic structure as that of Example 1. It differs from Example 1 only in that a submount 3B is provided with an optical path-forming groove 3b. The following explanation focuses on the difference.

In this example, the submount 3B was provided with a reflecting face 3a and the optical path-forming groove 3b by the following process. On an in-process submount made of silicon ({100} plane), an SiO$_2$ layer (not shown in the figure) having a thickness of 1 µm was formed as an insulating layer by the plasma CVD method. Part of the SiO$_2$ layer and part of the in-process submount were removed by chemical etching to form the optical path-forming groove 3b for guiding incoming light L emerging from an optical fiber 10 to a PD 2. In this example, the optical path-forming groove 3b had a width of 200 µm, a maximum length of 500 µm, and a depth of 100 µm. In the above expression, the width means the vertical dimension in FIG. 2(C), the maximum length means the maximum vertical dimension in FIG. 2(B), and the depth means the horizontal dimension in FIG. 2(B). In this example, all the faces ({111} plane) of the optical path-forming groove 3b including the reflecting face 3a were plated with gold.

The reflecting face 3a and the optical path-forming groove 3b as well as a mounting pattern as explained in Example 1 was repeatedly formed throughout the in-process submount. Then, the in-process submount was cut to obtain individual submounts 3B. A PD 2 was mounted on the submount 3B to form a submodule 6B. As with Example 1, the PD 2 was mounted on the submount 3B such that its rear face came into contact with the mounting pattern. Here, the rear face is a face opposite to the front face under which a light-receiving portion 2a is formed. In this case, the PD 2 was placed on the submount 3B such that it covered part of the optical path-forming groove 3b. This operation formed a submodule 6B. The submount 3B had a width of 500 µm, a length of 1,000 µm, and a thickness of 1,000 µm. In this example, the width means the vertical dimension in FIG. 2(C), the length means the vertical dimension in FIG. 2(B), and the thickness means the horizontal dimension in FIG. 2(B). The remaining process for producing the optical receiver was the same as that for Example 1.

As shown in FIG. 2(A), the structure of this example enables the incoming light L to enter the light-receiving portion 2a of the PD 2 mounted on the submount 3B after it is introduced into the optical path-forming groove 3b of the submount 3B and reflected at the reflecting face 3a.

EXAMPLE 3

Figure 3:
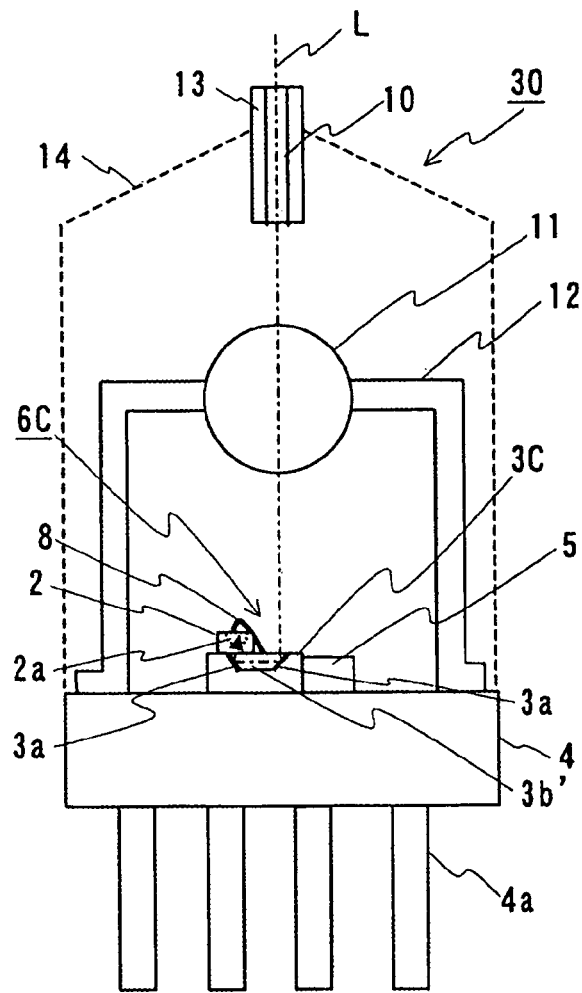
Figure 3:
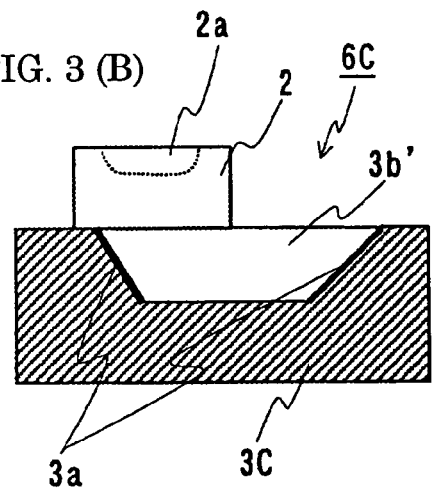
Figure 3:
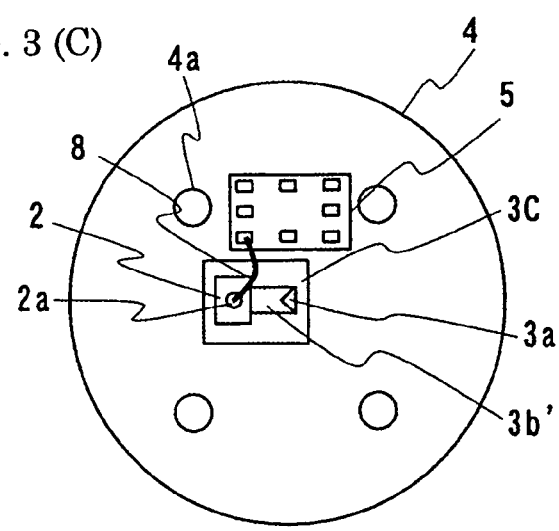

As explained above, Example 2 uses a submount provided with an optical path-forming groove having one reflecting face. However, the optical path-forming groove may have two reflecting faces. Accordingly, an example in which the optical path-forming groove has two reflecting faces is explained below. FIGS. 3(A) to 3(C) are views schematically showing the optical receiver of the present invention provided with an optical path-forming groove having two reflecting faces. FIG. 3(A) is a vertical cross section illustrating the entire optical receiver, FIG. 3(B) is an enlarged cross section showing a light-receiving device mounted on a submount, and FIG. 3(C) is a plan view when the lens-holding cap shown in FIG. 3(A) is removed. An optical receiver 30 of the present invention has the same basic structure as that of Example 2. It differs from Example 2 only in that a submount 3C is provided with an optical path-forming groove having two reflecting faces. The following explanation focuses on the difference.

In this example, the submount 3C was provided with an optical path-forming groove 3b' by a process similar to that for Example 2. More specifically, on an in-process submount made of silicon ({100} plane), an $SiO_2$ layer (not shown in the figure) having a thickness of 1 μm was formed by the plasma CVD method. Part of the $SiO_2$ layer and part of the in-process submount were removed by chemical etching to form the optical path-forming groove 3b'. In this example, the optical path-forming groove 3b' had a width of 200 μm, a maximum length of 500 μm, and a depth of 100 μm. In the above expression, the width means the vertical dimension in FIG. 3(C), the maximum length means the maximum horizontal dimension in FIG. 3(B), and the depth means the vertical dimension in FIG. 3(B). In this example, all the faces ({111} plane) of the optical path-forming groove 3b' were plated with gold, and the longitudinally opposed two faces were used as the reflecting faces 3a.

The reflecting faces 3a and the optical path-forming groove 3b' as well as a mounting pattern as explained in Example 1 were repeatedly formed throughout the in-process submount. Then, the in-process submount was cut to obtain individual submount 3C. A PD 2 was mounted on the submount 3C to form a submodule 6C. As with Example 2, the PD 2 was mounted on the submount 3C such that its rear face came into contact with the mounting pattern. Here, the rear face is a face opposite to the front face under which a light-receiving portion 2a is formed. In this case, the PD 2 was placed on the submount 3C such that it covered part of the optical path-forming groove 3b'. This operation formed a submodule 6C. The submount 3C had a width of 500 μm, a length of 1,000 μm, and a thickness of 1,000 μm. In this example, the width means the vertical dimension in FIG. 3(C), the length means the horizontal dimension in FIG. 3(B), and the thickness means the vertical dimension in FIG. 3(B).

In this example, the submodule 6C was placed directly on the coaxial type package 4 without using a submodule-supporting pole. The submodule 6C was fixed by soldering with an automatic die bonder using AuSn solder. More specifically, the submodule 6C was mounted such that the light-receiving layer of the PD 2 was nearly perpendicular to the optical axis of the incoming light L emerging from the optical fiber 10. In this configuration, the reflecting face 3a at the right-hand side of the submount 3C was slanted against the optical axis with an angle of about 45 degrees. As can be seen from FIG. 3(A), the light-receiving portion 2a of the PD 2 faces upward. The remaining process for producing the optical receiver was the same as that for Example 1.

As shown in FIG. 3(A), the structure of this example enables the incoming light L to enter the light-receiving portion 2a of the PD 2 mounted on the submount 3C after it is first reflected at a reflecting face 3a formed in the optical path-forming groove 3b' of the submount 3C and again reflected at the other reflecting face 3a in the groove 3b'.

EXAMPLE 4

Figure 4:
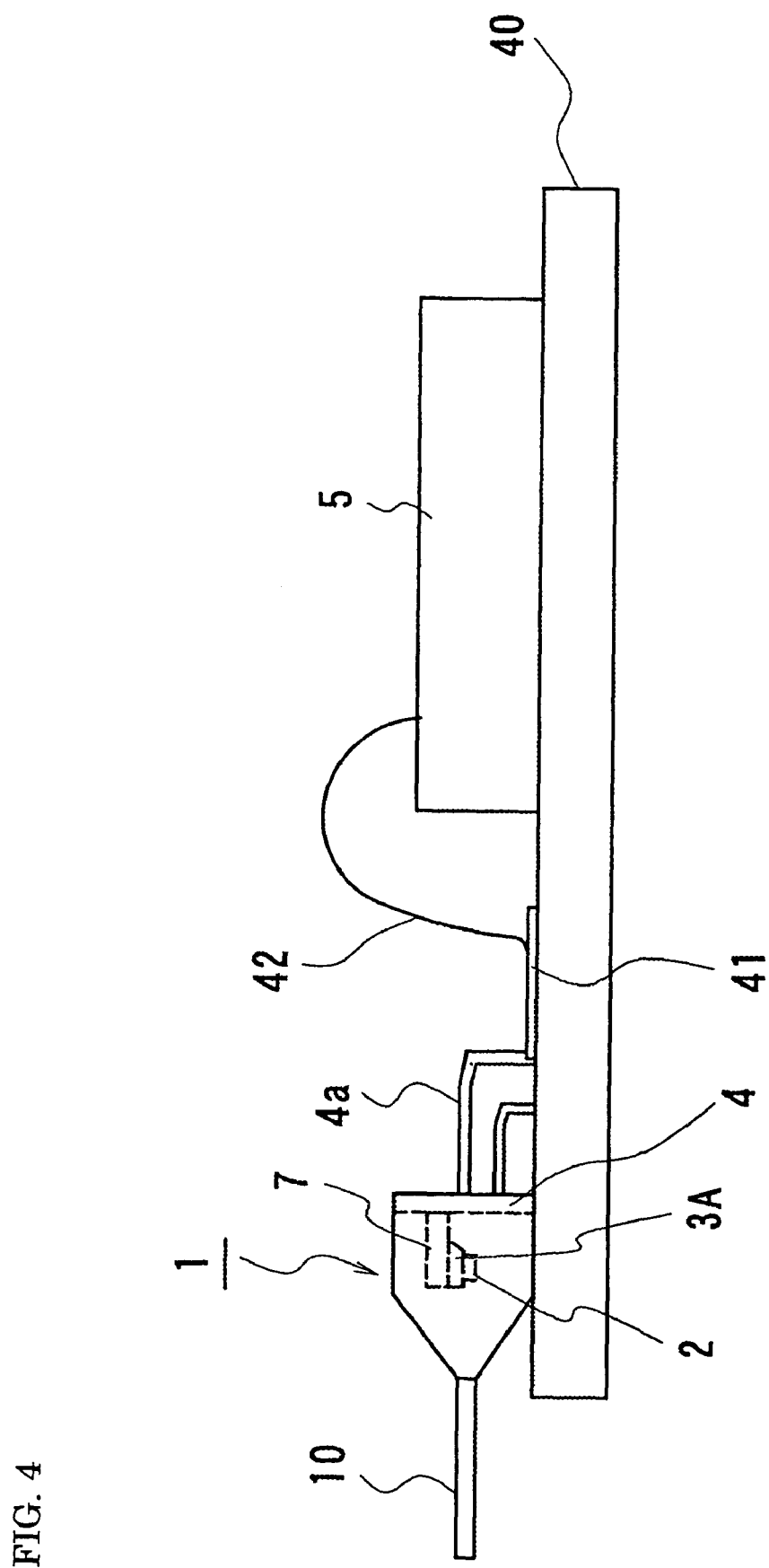
FIG. 4 is a diagram illustrating a pigtail-type optical receiver of the present invention mounted on a board.

In Examples 1 to 3, the preamplifying device is mounted directly on the coaxial type package. It may be mounted on a separately supplied board as shown in FIG. 4. FIG. 4 is a diagram illustrating a pigtail-type optical receiver of the present invention mounted on a board. The optical receiver can be formed by the following process. A wiring pattern 41 is formed on a board 40. A plurality of lead pins 4a penetrating a coaxial type package 4 are bent. The lead pins 4a are connected to the wiring pattern 41 by soldering to mount an optical receiver 1 on the board 40. A preamplifier IC 5 is mounted on the rear portion of the board 40. The preamplifier IC 5 is connected to the wiring pattern 41 with wires 42.

In this structure, a PD 2 of the optical receiver 1 is connected to the preamplifier IC 5 through wires (not shown in FIG. 4) connecting the PD 2 and the lead pins 4a, the lead pins 4a, the wiring pattern 41, and the wires 42. Although not shown in FIG. 4, electronic-circuit parts may be mounted at a place behind the preamplifier IC 5 on the board 40. Although FIG. 4 shows the submount 3A used in Example 1, the submounts 3B and 3C shown in FIGS. 2(A) and 3(A), respectively, may also be used. A pole 7 may be used as required.

EXAMPLE 5

Figure 5:
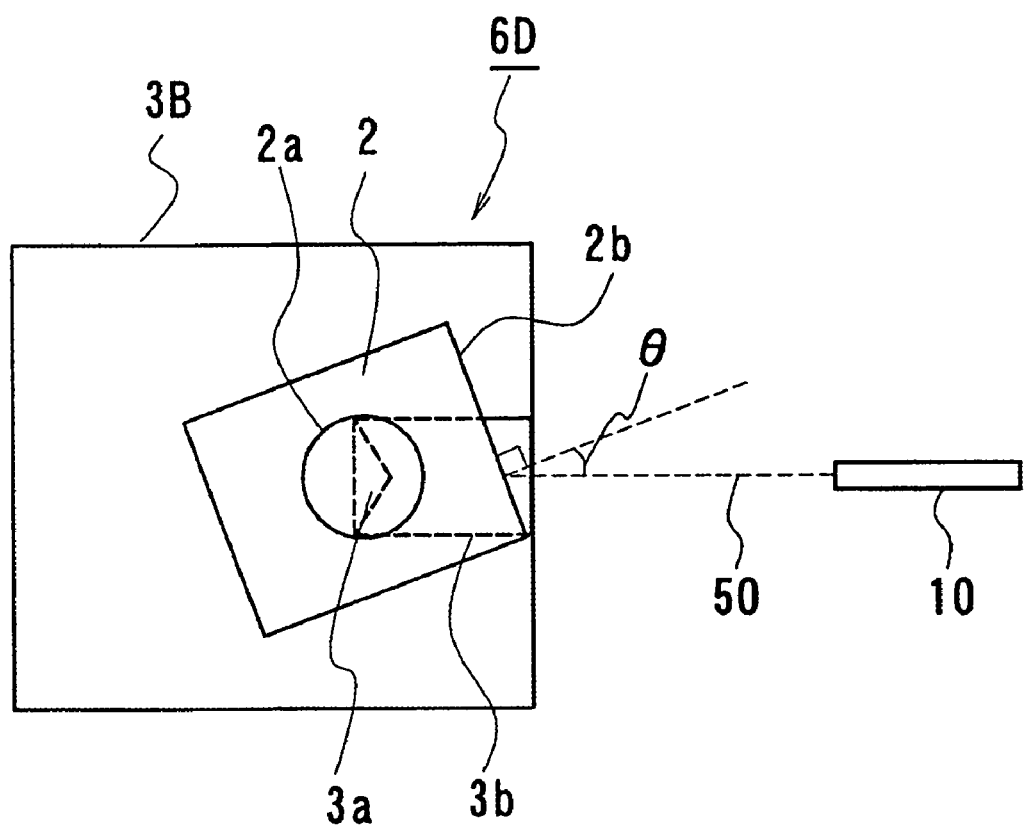
FIG. 5 is a front view showing a submodule mounted on a submount such that the face of the light-receiving device nearest to the incoming light is not perpendicular to the optical axis of the incoming light.

FIG. 5 is a front view showing a submodule mounted on a submount such that the face of the light-receiving device nearest to the incoming light is not perpendicular to the optical axis of the incoming light. In a submodule 6D shown in FIG. 5, a PD 2 is mounted on the submount 3B used in Example 2 such that the perpendicular of a face 2b (the face nearest to the incoming light) of the PD 2 slants against the optical axis 50 of the incoming light by an angle of θ=8 degrees. In the optical receiver of the present invention having this configuration, even if part of the incoming light is directly reflected at the face 2b, the reflected light does not return to the optical fiber 10, avoiding unstable operation of the light-emitting device at the signal-transmitting station. It is recommended that this type of configuration be applied to the optical receivers shown in Examples 1 and 2, in which the PD is placed on the submount such that the face of the PD nearest to the optical fiber directly faces the incoming light emerging from the optical fiber. This type of configuration may also be applied to the below-described receptacle-type optical receiver.

<Receptacle Type>

EXAMPLE 6

Figure 6:
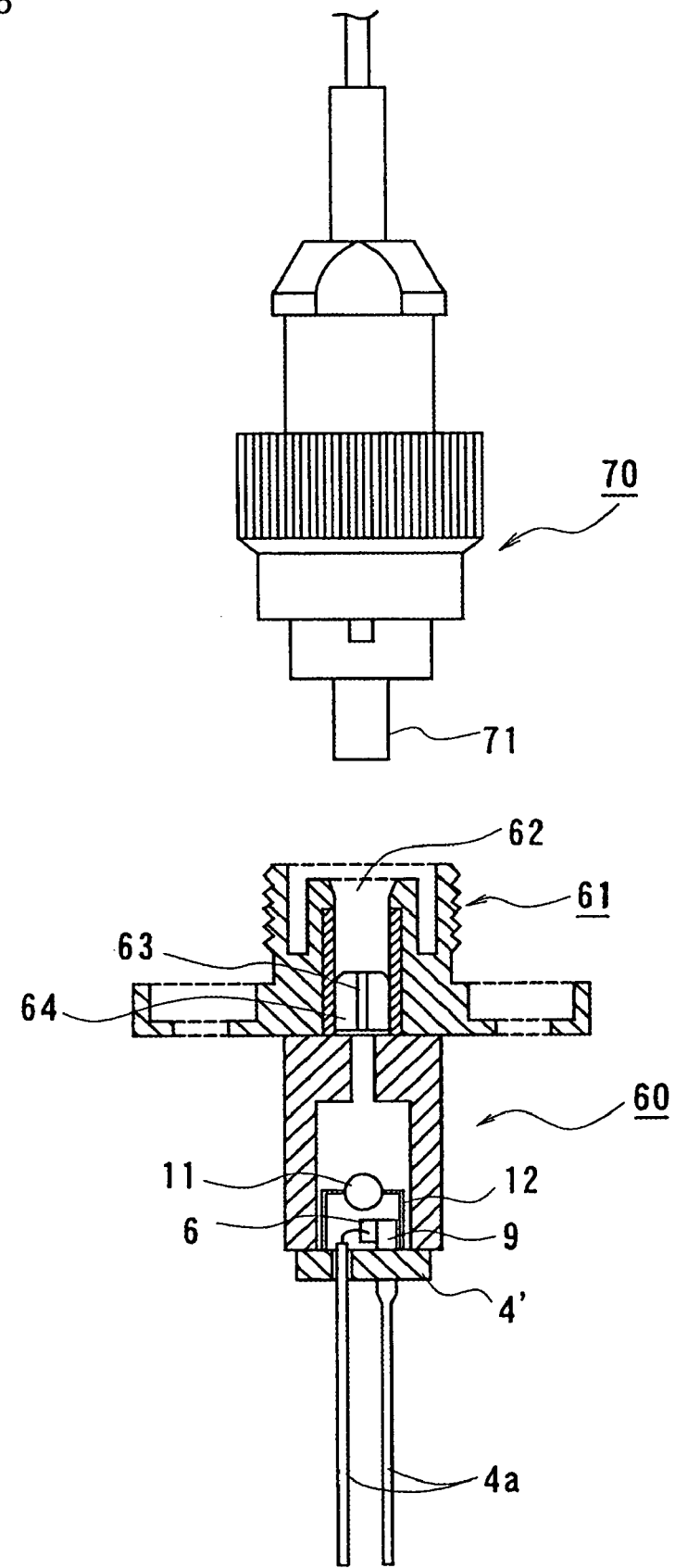
FIG. 6 is a vertical cross section showing a receptacle-type optical receiver of the present invention.
Figure 7:
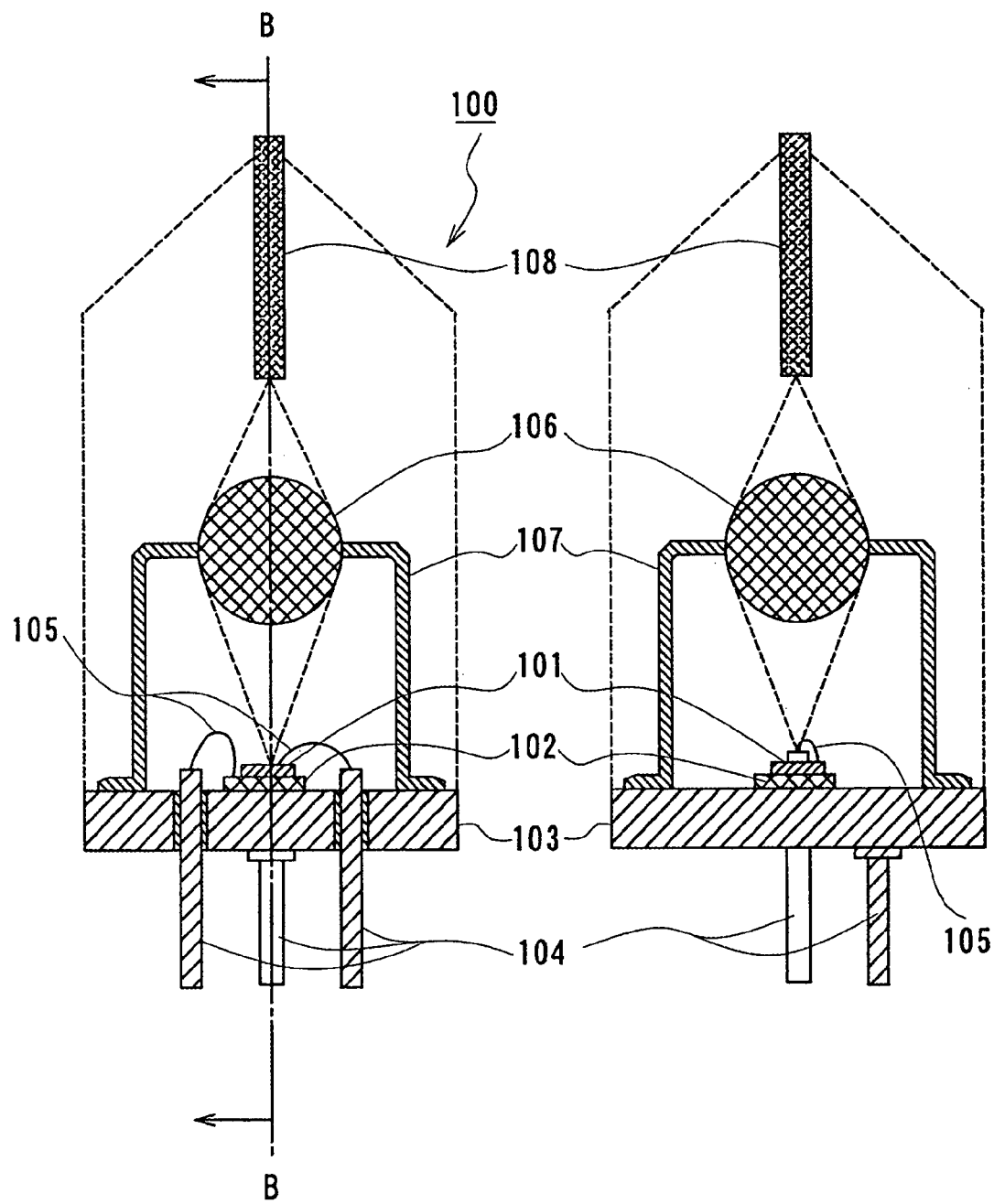
Figure 8:
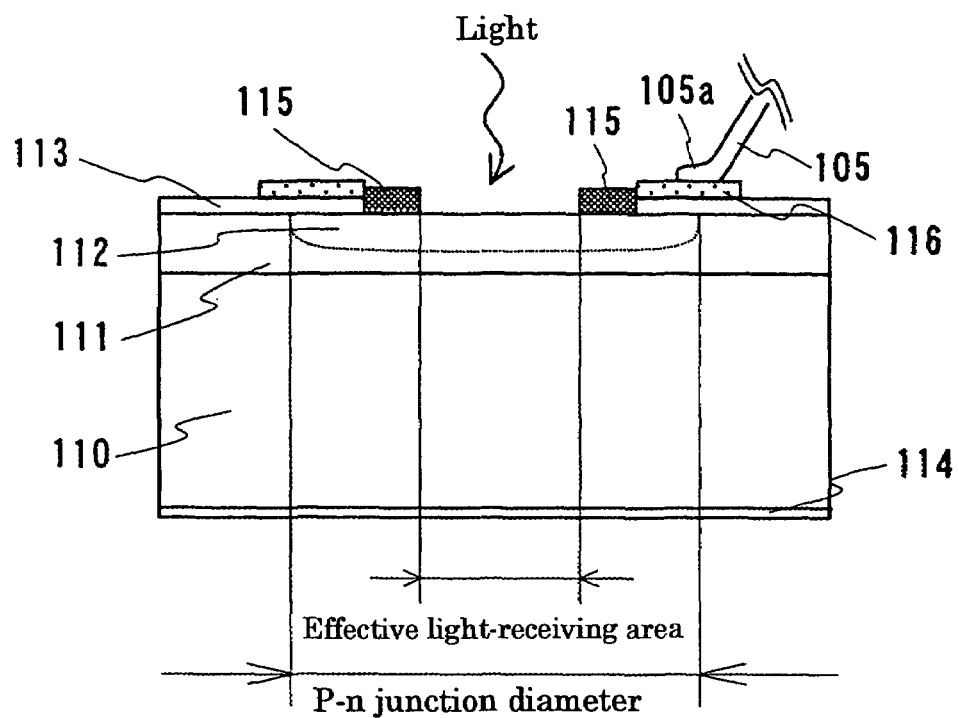
FIG. 8 is a cross-sectional view schematically showing a front-illuminated type light-receiving device.

FIG. 6 is a vertical cross section showing a receptacle-type optical receiver of the present invention. In Examples 1 to 5, a pigtail-type optical receiver is explained. However, the optical receiver of the present invention may also be applied to a receptacle type. In the vertical cross section shown in FIG. 6, an optical receiver 60 of the present invention comprises at its upper portion a connecting portion 61 for connecting to a connector 70 provided with an optical fiber ferrule 71 and at its lower portion a coaxial type package 4' provided with a submodule 6. The connecting portion 61 has an accepting hole 62 into which the optical fiber ferrule 71 is inserted. In this example, a stub 64 provided with an optical fiber 63 is placed at the innermost portion (lower portion in FIG. 6) of the accepting hole 62. The coaxial type package 4' is also provided with the following members:

(a) a pole 9 supporting the submodule 6;
(b) lead pins 4a for feeding electric power and taking out electric signals;
(c) a cap 12 supporting a condenser lens 11 at its top portion as with other examples such as Example 1; and
(d) a preamplifier IC (not shown in FIG. 6).

The optical receiver is capable of performing enhanced high-speed response and has excellent productivity as with other examples such as Example 1.

What is claimed is:

1. An optical receiver comprising:
    (a) an optical fiber;
    (b) a rear-illuminated type light-receiving device for receiving incoming light emerging from the optical fiber;
    (c) a submount that:
        (c1) supports the light-receiving device; and
        (c2) is provided with a reflecting face for reflecting the incoming light so that the light can enter the light-receiving device; and
    (d) a coaxial type package including:
        (d1) a first face facing the light-entering side, wherein the first face has a pole that is parallel to the optical axis of the incoming light, and wherein the submount is located on the pole; and
        (d2) a second face facing away from the light-entering side, wherein the second face has lead pins that are parallel to the optical axis of the incoming light.

2. An optical receiver as defined by claim 1, wherein the submount is provided with an optical path-forming groove for introducing the incoming light emerging from the optical fiber.

3. An optical receiver as defined by claim 2, wherein the optical path-forming groove is formed by etching.

4. An optical receiver as defined by claim 2, wherein the submount is made of a material selected from the group consisting of single-crystalline silicon, glass, and ceramic.

5. An optical receiver as defined by claim 2, wherein the light-receiving device is mounted on the submount such that the face of the light-receiving device nearest to the incoming light emerging from the optical fiber is not perpendicular to the optical axis of the incoming light.

6. An optical receiver as defined by claim 2, wherein the light-receiving device:
    (a) is made of a material selected from the group consisting of an InGaAs-based material and an InGaAsP-based material; and
    (b) comprises a light-receiving layer that aims at a wavelength band of a 1-µm band to a 1.6-µm band.

7. An optical receiver as defined by claim 2, the optical receiver being a member selected from the group consisting of a pigtail-type optical receiver, which is provided with an optical fiber at its one end, and a receptacle-type optical receiver, which has at its one end a connecting portion for coupling with an optical connector.

8. An optical receiver as defined by claim 2, wherein the coaxial type package is made of a material selected from the group consisting of iron, copper, copper-nickel alloy, and stainless steel.

9. An optical receiver as defined by claim 1, wherein the submount is made of a material selected from the group consisting of single-crystalline silicon, glass, and ceramic.

10. An optical receiver as defined by claim 1, wherein the light-receiving device is mounted on the submount such that the face of the light-receiving device nearest to the incoming light emerging from the optical fiber is not perpendicular to the optical axis of the incoming light.

11. An optical receiver as defined by claim 1, wherein the light-receiving device:
    (a) is made of a material selected from the group consisting of an InGaAs-based material and an InGaAsP-based material; and
    (b) comprises a light-receiving layer that aims at a wavelength band of a 1-µm band to a 1.6-µm band.

12. An optical receiver as defined by claim 1, the optical receiver being a member selected from the group consisting of a pigtail-type optical receiver, which is provided with an optical fiber at its one end, and a receptacle-type optical receiver, which has at its one end a connecting portion for coupling with an optical connector.

13. An optical receiver as defined by claim 1, wherein the coaxial type package is made of a material selected from the group consisting of iron, copper, copper-nickel alloy, and stainless steel.

14. An optical receiver as defined in claim 1 wherein the first face has a preamplifier arranged perpendicular to the light-receiving device.

15. An optical receiver as defined by claim 14, wherein the submount is provided with an optical path-forming groove for introducing the incoming light emerging from the optical fiber.

16. An optical receiver as defined by claim 14, wherein the submount is made of a material selected from the group consisting of single-crystalline silicon, glass, and ceramic.

17. An optical receiver as defined by claim 14, wherein the light-receiving device:
    (a) is made of a material selected from the group consisting of an InGaAs-based material and an InGaAsP-based material; and
    (b) comprises a light-receiving layer that aims at a wavelength band of a 1-µm band to a 1.6-µm band.

18. An optical receiver as defined by claim 14, the optical receiver being a member selected from the group consisting of a pigtail-type optical receiver, which is provided with an optical fiber at its one end, and a receptacle-type optical receiver, which has at its one end a connecting portion for coupling with an optical connector.

19. An optical receiver as defined by claim 14, wherein the coaxial type package is made of a material selected from the group consisting of iron, copper, copper-nickel alloy, and stainless steel.

* * * * *